US006390755B1

(12) United States Patent
Grant et al.

(10) Patent No.: US 6,390,755 B1
(45) Date of Patent: May 21, 2002

(54) EXHAUST DEVICE FOR USE IN A CLEAN ROOM, CLEANROOM, AND METHOD

(75) Inventors: Leroy Grant, Austin, TX (US); Gunter Hraschan, Dresden (DE)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/544,097

(22) Filed: Apr. 6, 2000

(51) Int. Cl.$^7$ ............................................... B65G 1/133
(52) U.S. Cl. .................. 414/217.1; 454/188; 454/187; 414/939; 414/940
(58) Field of Search ................ 454/187, 188, 454/189, 190, 191; 414/217.1, 935, 939, 940

(56) References Cited

U.S. PATENT DOCUMENTS

| | | | |
|---|---|---|---|
| 3,336,855 A | * | 8/1967 | Messina ...................... 454/187 |
| 3,616,624 A | * | 11/1971 | Marsh ......................... 454/187 |
| 3,774,522 A | * | 11/1973 | Marsh ......................... 454/190 |
| 3,776,121 A | * | 12/1973 | Truhan ........................ 454/190 |
| 4,693,173 A | * | 9/1987 | Saiki et al. .................. 454/187 |
| 4,923,352 A | * | 5/1990 | Tamura et al. ............... 414/225 |
| 5,316,518 A | * | 5/1994 | Challenger ................... 454/187 |
| 5,553,496 A | | 9/1996 | Nishiyama .................. 73/432.1 |
| 5,681,219 A | * | 10/1997 | LeFevre et al. .............. 454/187 |
| 5,928,077 A | | 7/1999 | Kisakibaru ................... 454/187 |
| 5,934,992 A | * | 8/1999 | Sohier et al. ................ 454/190 |

FOREIGN PATENT DOCUMENTS

| | | | | |
|---|---|---|---|---|
| JP | 129123 | * | 8/1983 | ................. 454/187 |
| JP | 42533 | * | 3/1985 | ................. 454/187 |
| JP | 360140034 | * | 7/1985 | ................. 454/187 |
| JP | 403199579 | * | 8/1991 | ................. 454/187 |

* cited by examiner

Primary Examiner—Harold Joyce
Assistant Examiner—Derek S. Boles

(57) ABSTRACT

In a single cleanroom (200) for first (230) and second (240) wafer processing machines, an exhaust device (260) surrounds the second machine (240) that temporarily produces exhaust gas (250) which is detrimental to the processes in the first machine (230). Additionally to a first directed air flow (220) available in the cleanroom (200), the exhaust device (260) generates—in the proximity of gas leakage openings of the second machine (240)—a second air flow (270) that prevents the exhaust gas (250) from further being moved by the first air flow (220) to the first machine (230).

8 Claims, 4 Drawing Sheets

- PRIOR ART -

US 6,390,755 B1

EXHAUST DEVICE FOR USE IN A CLEAN ROOM, CLEANROOM, AND METHOD

FIELD OF THE INVENTION

The present invention relates to ventilation equipment, and more particularly, to an exhaust device used in a cleanroom for manufacturing semiconductor devices.

BACKGROUND OF THE INVENTION

In the semiconductor industry, the cleanliness requirement for a cleanroom has been becoming severer from year to year. Convenient references for cleanrooms are U.S. Pat. No. 4,693,173 to Saiki et al., and U.S. Pat. No. 5,553,496 to Nishiyama et al.

FIG. 1 illustrates a simplified diagram of separate cleanrooms 100 and 100'. Elements in room 100' having a prime marker are analogous to the elements in room 100.

In cleanroom 100, air conditioning system 110 provides air flow 120 that goes substantially in a single direction, from ceiling 101 to room floor 102. Often, air conditioning system 110 establishes an over pressure in the cleanroom (so-called plenum system). Also, air conditioning system 110 can provide reuse of air (circulation outside room 100 from floor 102 to ceiling 101, through filter 112)

While a variety of wafer manufacturing facilities stand on floor 102, further service room 103 below floor 102 provides infrastructure, for example, by electrical cable 104 and pipe 106.

Having rooms 100 and 100' separated is required because wafer processing machine 140 in room 100' could influence wafer processing machine 130 in room 100 by chemicals that parasitically leak out from machine 140. This problem is now explained with more detail by way of example. Processing machine 130 of a first type processes wafer 139 by deep ultraviolet (DUV) lithography. This comprises the application of photoresist pattern, exposure by ultraviolet radiation, etching and other steps.

In a consecutive manufacturing step, processing machine 140 of a second type seals wafer 149 by dispersing IMID (polyimide) through nozzle 142. IMID is a liquid that is temporarily stored in tank 144 and transported in pipe 106'. Sometimes, for example, once a week, IMID-machine 140 with tank 144, pipe 106' and nozzle 142 is cleaned (rinsed) by a solvent, for example, NMP (1Methyl-2Pyrrolidone,M-pyrol). NMP that is also a liquid easily converts into gas that becomes part of cloud 150 with exhaust gas. Exhaust gas containing NMP is detrimental to the processes in DUV-machine 130 because they would attack wafers 139 (still unsealed) being processed in DUV-machine 130.

Since cloud 150 leaves machine 140, there is a danger that room air flow 120' contributes to the distribution of cloud 150 with exhaust gas throughout room 100'.

As explained, the prior art prevents contamination of processes by chemicals, (e.g., NMP interfering with the DUV processes) by providing separate cleanrooms 100 and 100'. The separation is, however, inconvenient and expensive. For example, the wafers have to be carried from room 100 to room 101'.

The present invention seeks to provide a means which mitigates or avoids these and other disadvantages and limitations of the prior art.

Detailed Description of a Preferred Embodiment

In a single cleanroom for first and second wafer processing machines, an exhaust device surrounds the second machine that temporarily produces exhaust gas which is detrimental to the processes in the first machine. Additionally to a first directed air flow available in the cleanroom, the exhaust device generates—in the proximity of gas leakage openings of the second machine—a second air flow that prevents the exhaust gas from further being moved by the first air flow to the first machine.

Figure 2:
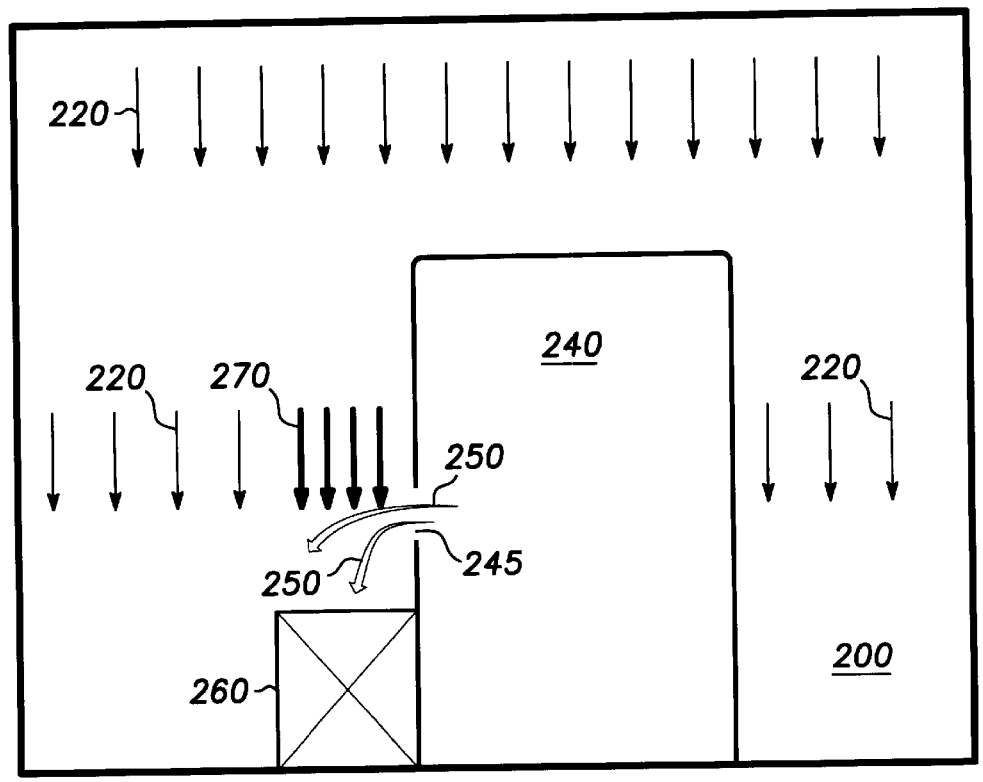
FIG. 2 illustrates a simplified diagram of an exhaust device according to the present invention for use in a cleanroom.

FIG. 2 illustrates a simplified diagram of exhaust device 260 for use in cleanroom 200 according to the present invention. In cleanroom 200, directed first air flow 220 having a first speed (plain arrows) surrounds processing machine 240 that produces gas 250 at leakage opening 245. Opening 245 stands simplified for any opening in machine 240 where gas 250 could evade. Exhaust device 260 is adapted to be located outside opening 245 and characterized in that exhaust device 260 generates in the proximity of opening 245 an equally directed second air flow 270 having a second, higher speed (bold arrows) at opening 245 to substantially prevent gas 250 from moving from second air flow 270 to first air flow 220.

In other words, the present invention relates to exhaust device 260 that prevents the contamination of cleanroom 200 by exhaust gas 250 produced at opening 245 of processing machine 240. Machine 240 is located in cleanroom 200 having first air flow 220. Exhaust device 260 being adapted to generate—in the proximity of opening 245—second air flow 270 at substantially higher speed (bold arrows) than the speed of first air flow 220.

Further, the present invention also relates to a gas suction device (e.g., device 260) for use in a cleanroom having a laminar air flow ("room flow") in a first direction (cf. arrows 220), the device being adapted to be attached to the outside of a wafer processing machine (e.g., machine 240) and preventing that gases (e.g., gas cloud 250) leaving the machine go into the air flow by providing an air suction (cf. arrows 270, a "defense flow") in the same direction as the air flow. The migration of exhaust gases from the defense flow into the room flow is prevented. Separate air flows (i.e., flows 220 and 270) have a common border that prevents gas 250 moving from flow 270 to flow 220. In comparison to the pressure in room 200, the defense flow provides a local underpressure zone.

Further details for exhaust device 260 and its application in a cleanroom are explained in connection with FIGS. 3–6.

Figure 3:
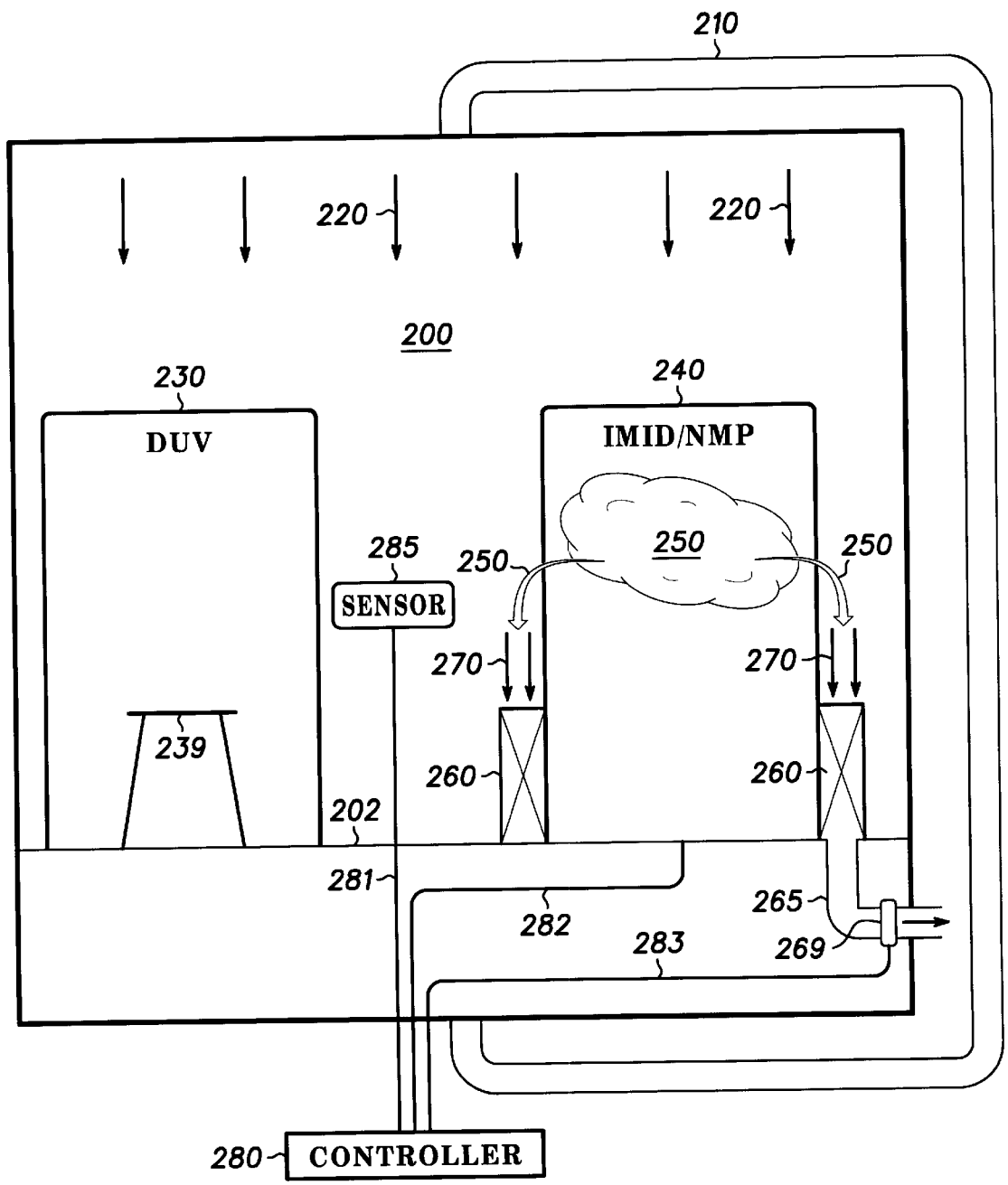
FIG. 3 illustrates a simplified diagram of the cleanroom according to the present invention comprising the exhaust device of FIG. 2 and two machines.

FIG. 3 illustrates a simplified diagram of cleanroom 200 according to the present invention with the exhaust device of FIG. 2 and machines 230 and 240. In FIGS. 2–3, reference numbers 200, 220, 240, 250, 260 and 270 refer to analogous elements. As illustrated in FIG. 3, cleanroom 200 comprises machine 230 for processing semiconductor wafers 239, machine 240 (e.g., also for processing wafers), air conditioning system 210, an exhaust device 260 (cf. FIG. 2).

At least temporarily, machine 240 employs a chemical substance which produces gas 250 that is detrimental to processing semiconductor wafer 239 in machine 230. For example, machine 240 is an IMID-processor that is cleaned from time to time by NMP that is as explained above detrimental to the processes in DUV-machine 230.

Figure 1:
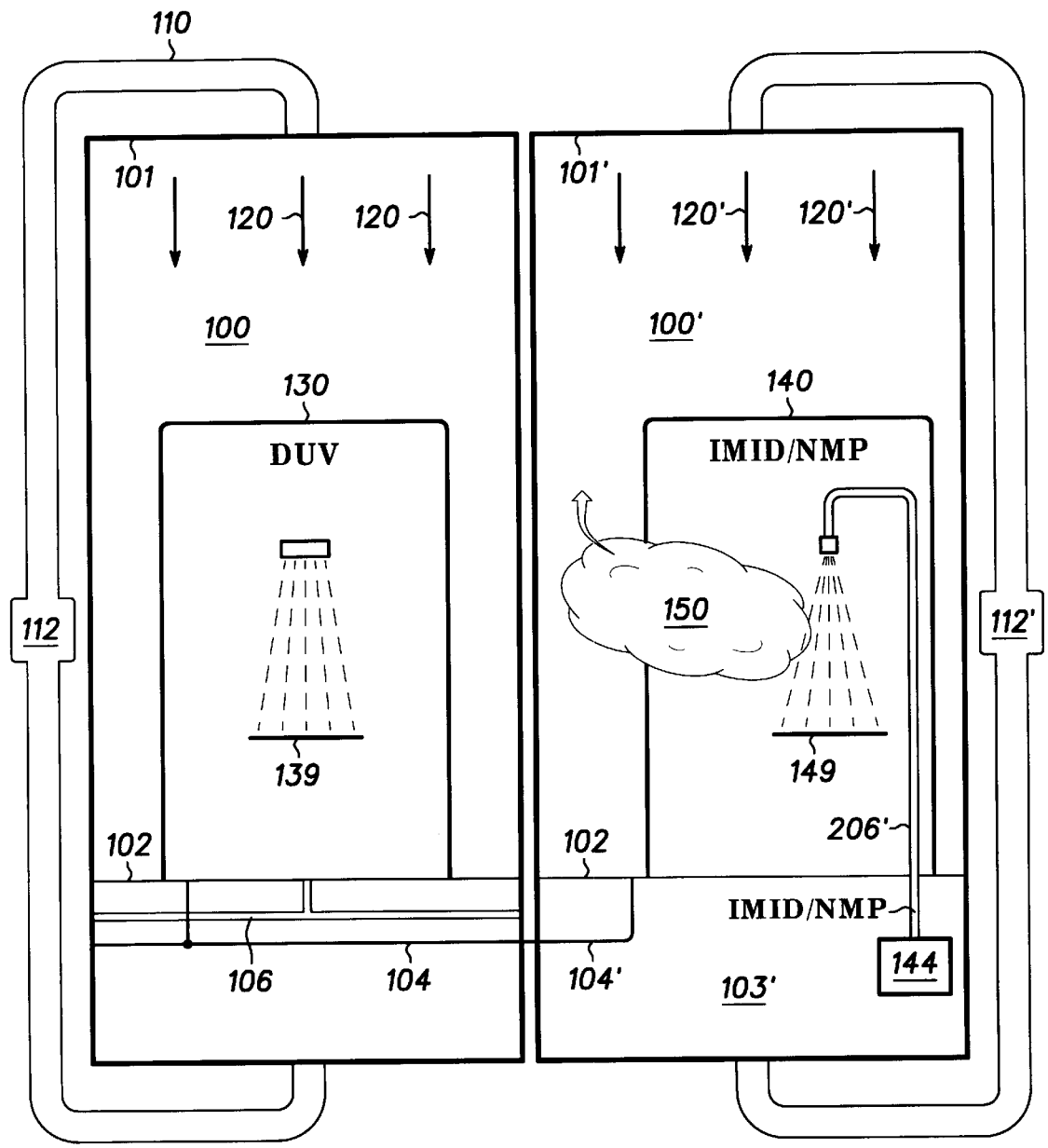
FIG. 1 illustrates a simplified diagram of separate cleanrooms in a prior art arrangement.

Air conditioning system 210 (cf. system 110 in FIG. 1) provides first air flow 220 (cf. FIG. 2) being substantially laminar and having a first speed. Exhaust device 260 provides second air flow 270 (cf. FIG. 2) around machine 240 (details also in FIG. 4). FIG. 3 illustrates two portions of device 260 with identical reference numbers at both sides of machine 240 to indicate that exhaust device 260 is, preferably, located around machine 240. Air flow 240 is also substantially laminar and has a second speed that is higher that the first speed of air flow 220 to allow gas 250 to go with air flow 270 and prevents gas 250 from going to air flow 220 and to migrate to machine 230. Preferably, machines 230 and 240 stand on floor 202. For convenience, details of an optional service room below floor 202 are not illustrated.

Preferably, exhaust device 260 is attached to pipe 265 for removing gas 250 from cleanroom 200. Preferably, pipe 265 comprises air pump 269 or any other ventilation device having a throughput performance in a useful range between 100 and 1000 cubic meter per hour. A convenient range is between 500 and 900 cubic meter per hour.

Preferably, pipe 265 and pump 269 are not coupled to air conditioning system 210 so that exhaust gases 250 are substantially completely removed from cleanroom 200.

It is an advantage of the present invention, that processing machines of both types (i.e., DUV and IMID) can be located in single cleanroom 200. The problems of the prior art, such as for example, the need to carry the wafers between separate cleanroooms (100, 100', cf. FIG. 1) are mitigated.

Figure 5:
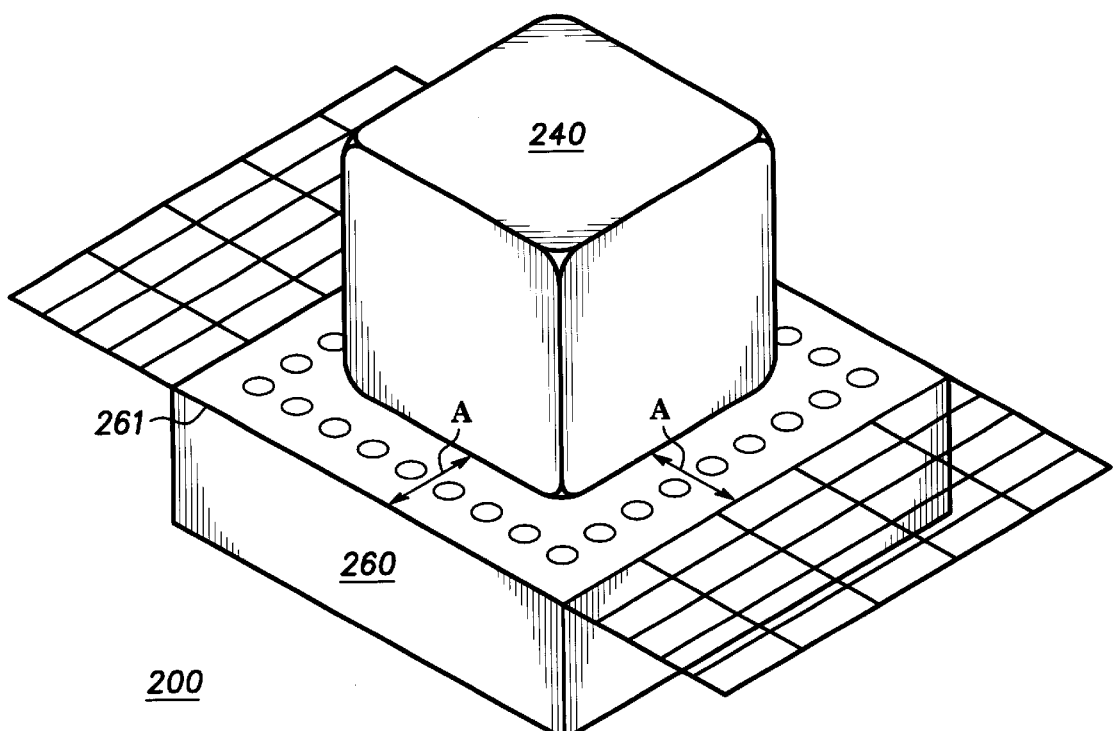
FIG. 5 illustrates a simplified perspective diagram of an alternative arrangement of the exhaust device of FIGS. 2–4 in the floor of the cleanroom.

FIG. 3 illustrates exhaust device 260 standing on floor 202. This is convenient, but not essential for the present invention. An embodiment where the upper side of exhaust device 260 is coplanar on the same level with floor 260 is illustrated in FIG. 5.

FIG. 3 also illustrates controller 280, gas sensor 285 as well as control line 281 (from sensor 285), control line 282 (from machine 240) and control line 283 (to air pump).

Preferably, controller 280 activates or deactivates pump 269 (line 283) so that exhaust device 260 provides air flow 270 when the gas concentration passes a predetermined threshold (operation of sensor 285, line 281), when machine 240 employs the chemical substance (e.g., NMP cleaning), or when a predetermined failure occurs in machine 240 (failure signal via line 282). Details for the operation of controller 280 are illustrated in connection with FIG. 6. The threshold relates to the maximum allowable concentration of gas 250 in the vicinity of machine 230.

Figure 4:
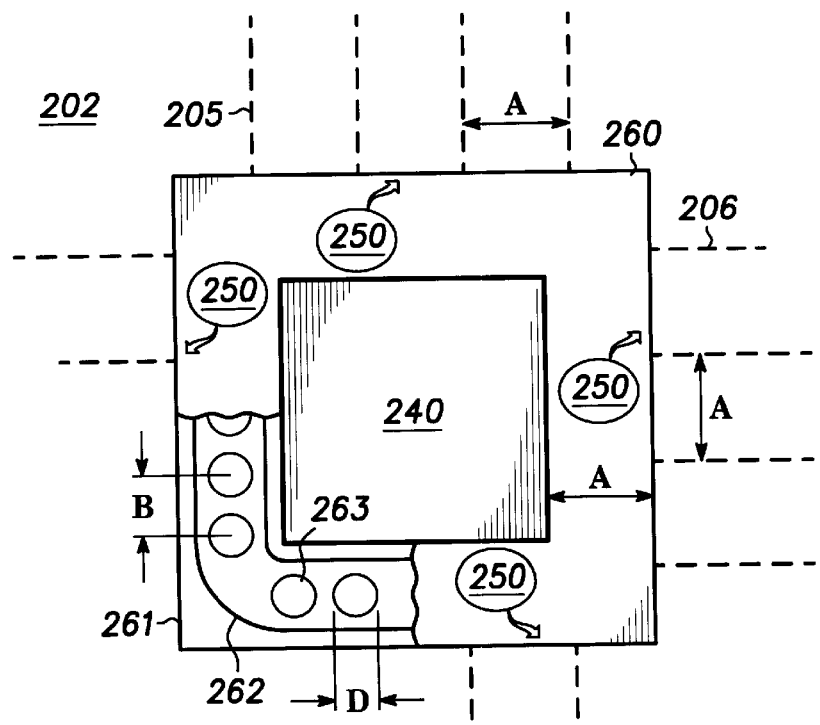
FIG. 4 illustrates a simplified top view diagram of a machine surrounded by the exhaust device of FIG. 2.

FIG. 4 illustrates a simplified top view diagram of machine 240 surrounded by exhaust device 260. For simplicity, pipe 265 (cf. FIG. 3) is not shown. By arranging device 260 around machine 240, exhaust device 260 substantially provides that second air flow 270 surrounds machine 240. Similar to FIG. 3, plain arrows illustrating gas 250 indicate that gas 250 is substantially only allowed to be above device 260, but is prevented from migrating into the rest of the cleanroom.

Width A of exhaust device 260 conveniently corresponds to the structure of floor 202 illustrated by dashed gridlines 205 and 206 (inter-grid distance A). This optional feature allow a modular implementation of exhaust device 260 into cleanrooms together with other devices.

For simplicity, FIG. 4 illustrates details for a possible implementation of exhaust device 260 conveniently only in the lower left corner. In the example, exhaust device has outer wall 261 and cylindrical tube 262 (diameter smaller than A) with a plurality of openings 263 at the top. Openings 263 ("aperture") have diameters D (e.g., 20 . . . 200 milli meter) and are spaced by B (e.g., 20 . . . 200 milli meter from center to center). Preferably, D and B are equal for all openings.

FIG. 5 illustrates a simplified perspective diagram of an alternative arrangement of exhaust device 260 surrounding the lower part of machine 240 inside floor 202 of cleanroom 200. The upper side of outer wall 261 touches floor 202 that is implemented by a steel grid.

Figure 6:
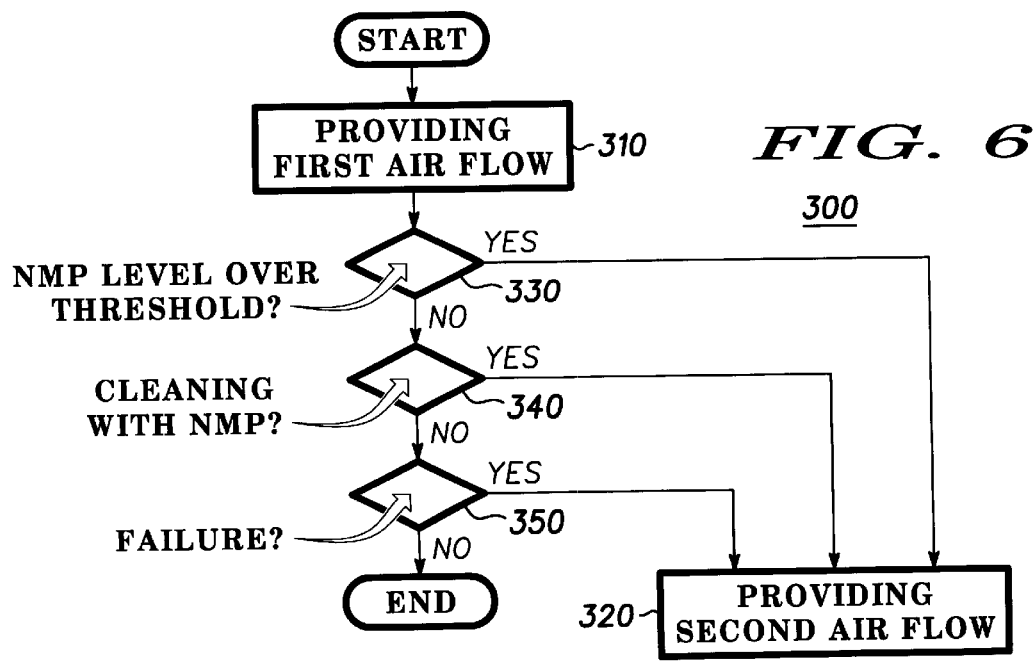
FIG. 6 illustrates a simplified flow chart diagram of a method according to the present invention.

FIG. 6 illustrates a simplified flow chart diagram of method 300 to prevent gas from migrating from an opening of a processing machine into a cleanroom. Method 300 comprises the following steps: providing 310 directed first air flow 220 having a first speed to surround the processing machine (e.g., machine 240); and providing 330—in the proximity of the opening—equally directed second air flow 270 having a second, higher speed at the opening. The gas is thereby substantially prevented from moving from second air flow 270 to first air flow 220. Repetitions of method 300 can be accomplished by a person of skill in the art without the need of further explanation herein.

Preferably, step 320 is performed only conditionally. This is illustrated by query steps 330, 340 and 350 leading either to step 320 (YES-alternative) or to the end (NO-alternative) of method 300. For example, possible conditions are: step 330, when the concentration of the gas at a predetermined location in the cleanroom exceeds a predetermined threshold (e.g., "NMP LEVEL OVER THRESHOLD?"); step 340, when machine 240 is cleaned with the chemical substance (e.g., "CLEANING WITH NMP?"); or step 350, when machine 240 has a failure ("FAILURE ?"). Preferably, the execution of method 300 is supported by controller 280 and sensor 285. Persons of skill in the art can write software for controller 280 or modify method 300 by introducing further conditions.

While the invention has been described in terms of particular structures, devices and methods, those of skill in the art will understand based on the description herein that it is not limited merely to such examples and that the full scope of the invention is properly determined by the claims that follow.

What is claimed is:

1. An exhaust device for use in a cleanroom having an air circulating air-conditioning system_where a directed first air flow having a first speed surrounds a processing machine that produces a gas at an opening, said exhaust device being adapted to be located outside said opening, said exhaust device characterized in that it generates in the proximity of said opening an equally directed second air flow having a second, higher speed at said opening to substantially prevent said gas from moving from said second air flow to said first air flow and that it removes air of said second air flow from said cleanroom, wherein the exhaust device of claim 1 implemented by a tube having a plurality of apertures.

2. A cleanroom comprising:
   a first machine for processing a semiconductor wafer;
   a second machine, said second machine at least temporarily employing a chemical substance which produces a gas that is detrimental to processing said semiconductor wafer in said first machine;

an air conditioning system providing a first air flow being substantially laminar and having a first speed; and an exhaust device providing a second air flow around said second machine, said second air flow being also substantially laminar and having a second speed that is higher that said first speed to allow said gas to go with said second air flow but preventing said gas from going to said first air flow and to migrate to said first machine.

3. The cleanroom of claim 2 wherein said exhaust device is attached to a pipe for removing said gas from said cleanroom.

4. The cleanroom of claim 2, wherein said pipe comprises an air pump.

5. The cleanroom of claim 4, wherein said air pump has a throughput performance between 100 and 1000 cubic meter per hour.

6. The cleanroom of claim 5, wherein said air pump has a throughput performance between 500 and 900 cubic meter per hour.

7. The cleanroom of claim 2, wherein said first machine is a DUV-machine and said machine is an IMID-machine that is temporarily cleaned by NMP.

8. The cleanroom of claim 2 wherein said exhaust device provides said second air flow when the gas concentration passes a predetermined threshold, the second machine employs said chemical substance, or when there is a predetermined failure in said second machine.

* * * * *